(12) United States Patent
Raman et al.

(10) Patent No.: US 8,747,687 B2
(45) Date of Patent: Jun. 10, 2014

(54) AQUEOUS POLISHING AGENT COMPRISING SOLID POLYMER PARTICLES AND TWO COMPLEXING AGENTS AND ITS USE IN A PROCESS FOR POLISHING PATTERNED AND UNSTRUCTURED METAL SURFACES

(75) Inventors: Vijay Immanuel Raman, Mannheim (DE); Ilshat Gubaydullin, Ludwigshafen (DE); Yuzhuo Li, Heidelberg (DE); Mario Brands, Ludwigshafen (DE); Yongqing Lan, Potsdam, NY (US)

(73) Assignee: BASF SE, Ludwigshafen (DE)

( * ) Notice: Subject to any disclaimer, the term of this patent is extended or adjusted under 35 U.S.C. 154(b) by 84 days.

(21) Appl. No.: 13/318,964

(22) PCT Filed: Apr. 19, 2010

(86) PCT No.: PCT/EP2010/055122
§ 371 (c)(1),
(2), (4) Date: Nov. 4, 2011

(87) PCT Pub. No.: WO2010/127938
PCT Pub. Date: Nov. 11, 2010

(65) Prior Publication Data
US 2012/0058641 A1 Mar. 8, 2012

(30) Foreign Application Priority Data
May 6, 2009 (EP) ...................................... 09159543

(51) Int. Cl.
*C03C 15/00* (2006.01)
(52) U.S. Cl.
USPC .......... 216/88; 252/79.1; 252/79.2; 252/79.3; 252/79.4; 438/689; 438/690; 438/691; 438/692
(58) Field of Classification Search
USPC ............ 252/79.1–79.4; 438/689–692; 216/88
See application file for complete search history.

(56) References Cited

U.S. PATENT DOCUMENTS

| | | | |
|---|---|---|---|
| 7,037,351 B2* | 5/2006 | Li et al. ............................ | 51/298 |
| 7,427,361 B2* | 9/2008 | Small et al. .................. | 252/79.1 |
| 2006/0243702 A1 | 11/2006 | Minamihaba et al. | |
| 2007/0128873 A1 | 6/2007 | Minamihaba et al. | |
| 2009/0087988 A1* | 4/2009 | Saie .............................. | 438/693 |
| 2010/0148109 A1 | 6/2010 | Schaedler et al. | |
| 2010/0178768 A1 | 7/2010 | Li | |
| 2010/0221519 A1 | 9/2010 | Venkatesh et al. | |
| 2010/0261853 A1 | 10/2010 | Gubaydullin et al. | |
| 2010/0284882 A1 | 11/2010 | Koch et al. | |
| 2011/0091733 A1 | 4/2011 | Feuerhake et al. | |
| 2011/0092635 A1 | 4/2011 | Venkatesh et al. | |
| 2011/0189487 A1 | 8/2011 | Zacharias et al. | |
| 2011/0269312 A1 | 11/2011 | Li et al. | |

FOREIGN PATENT DOCUMENTS

| | | |
|---|---|---|
| WO | 2005 014753 | 2/2005 |
| WO | 2006 086265 | 8/2006 |
| WO | 2008 138977 | 11/2008 |
| WO | 2008 151918 | 12/2008 |
| WO | 2009 027310 | 3/2009 |
| WO | 2009 050176 | 4/2009 |
| WO | 2009 065928 | 5/2009 |
| WO | 2009 065929 | 5/2009 |
| WO | 2009 071351 | 6/2009 |
| WO | 2010 100226 | 9/2010 |
| WO | 2010 100227 | 9/2010 |
| WO | 2010 100228 | 9/2010 |
| WO | 2010 100229 | 9/2010 |
| WO | 2010 100232 | 9/2010 |
| WO | 2010 100233 | 9/2010 |

OTHER PUBLICATIONS

International Search Report Issued Aug. 26, 2010 in PCT/EP10/055122 Filed Apr. 19, 2010.
U.S. Appl. No. 61/102,457, filed Oct. 3, 2008, Li, et al.
U.S. Appl. No. 13/318,911, filed Nov. 4, 2011, Raman, et al.
U.S. Appl. No. 60/944,198, filed Jun. 15, 2007, Li.
U.S. Appl. No. 13/266,520, filed Oct. 27, 2011, Li, et al.
U.S. Appl. No. 13/376,270, filed Dec. 5, 2011, Zhang, et al.
U.S. Appl. No. 13/580,039, filed Aug. 20, 2012, Raman, et al.
U.S. Appl. No. 13/510,514, filed May 17, 2012, Raman, et al.
U.S. Appl. No. 13/510,830, filed May 18, 2012, Raman, et al.
U.S. Appl. No. 13/503,753, filed Apr. 24, 2012, Lauter, et al.

* cited by examiner

*Primary Examiner* — Lan Vinh
*Assistant Examiner* — Maki Angadi
(74) *Attorney, Agent, or Firm* — Oblon, Spivak, McClelland, Maier & Neustadt, L.L.P.

(57) ABSTRACT

An aqueous CMP agent, comprising (A) solid polymer particles interacting and forming strong complexes with the metal of the surfaces to be polished; (B) a dissolved organic non-polymeric compound interacting and forming strong, water-soluble complexes with the metal and causing an increase of the material removal rate MRR and the static etch rate SER with increasing concentration of the compound (B); and (C) a dissolved organic non-polymeric compound interacting and forming slightly soluble or insoluble complexes with the metal, which complexes are capable of being adsorbed by the metal surfaces, and causing a lower increase of the MRR than the compound (B) and a lower increase of the SER than the compound (B) or no increase of the SER with increasing concentration of the compound (C); a CMP process comprising selecting the components (A) to (C) and the use of the CMP agent and process for polishing wafers with ICs.

20 Claims, No Drawings

AQUEOUS POLISHING AGENT COMPRISING SOLID POLYMER PARTICLES AND TWO COMPLEXING AGENTS AND ITS USE IN A PROCESS FOR POLISHING PATTERNED AND UNSTRUCTURED METAL SURFACES

FIELD OF THE INVENTION

The invention is directed to a novel aqueous polishing agent and its use in a novel process for polishing, in particular for the chemical mechanical polishing (CMP), of patterned and unstructured metal surfaces.

BACKGROUND OF THE INVENTION

Integrated circuits (ICs) consist of structured electrically semiconducting, non-conducting and conducting thin layers. These patterned layers are customarily prepared by applying a layer material, for example, by vapor deposition and patterning it by a microlithographic process. By way of the combination of the various electrically semiconducting, non-conducting and conducting layered materials the electronic circuit elements such as transistors, capacitors, resistors and wirings are fabricated.

The quality of an IC and of its function depends particularly on the precision with which the various layer materials can be applied and patterned.

However, with an increasing number of layers the planarity of the layers decreases significantly. This leads to the failure of one or more functional elements of the IC and, therefore, to the failure of the complete IC after a certain number of layers has been reached.

The decrease of the planarity of the layers is caused by the buildup of new layers on top of layers already patterned. By the patterning altitude differences are created which can add up to 0.6 µm per layer. These altitude differences add up from layer to layer and bring about that the next following layer can no longer be applied onto a planar surface but only onto an uneven surface. The first result is that the layer subsequently applied has an irregular thickness. In extreme cases, imperfections, defects in the electronic functional elements and lacking electrical contacts are caused. Moreover, uneven surfaces lead to problems with the patterning. In order to be able to create sufficiently small patterns, an extremely acute depth of focus is a necessary in the microlithographic process step. However, these patterns can only be imaged with acuity on a planar surface. The more the locations deviate from the planarity, the murkier the image becomes.

In order to solve this problem, a so-called chemical mechanical polishing (CMP) is carried out. The CMP causes a global planarization of the patterned surface by the removal of protruding features of the layer until a planar layer is obtained. Because of this, the subsequent buildup can take place on top of a planar surface exhibiting no altitude differences, and the precision of the patterning and of the functionality of the elements of the IC is maintained.

Typical examples for the global planarization are dielectric CMP, nickel phosphide CMP and silicium or polysilicium CMP.

In addition to the global planarization to overcome lithographical difficulties, there are two other important applications for CMP. One is to fabricate microstructures. Typical examples for this application are copper CMP, tungsten CMP or shallow trench isolation (STI) CMP, in particular the Damascene process described below. The other is defect correction or elimination, as for example sapphire CMP.

A CMP process step is carried out with the help of special polishers, polishing pads and polishing agents which are also referred to in the art as polishing slurries or CMP slurries. A CMP slurry is a composition, which in combination with the polishing pad causes the removal of the material to be polished.

In case that wafers with semiconductor layers are to be polished, the precision requirements for the process step and, thus, the requirements set for the CMP slurry are particularly strict.

A series of parameters are used for evaluating the efficiency of CMP slurries and for characterizing their activity. The material removal rate (MRR), that is the speed with which the material to be polished is removed, the selectivity, that is the ratio of the removal rate of the material to be polished to the removal rates of other materials present, the removal uniformity within a wafer (WIWNU; within wafer non-uniformity) and the removal uniformity from wafer to wafer (WTWNU; wafer to wafer non-uniformity) as well as the number of defects per unit of area rank among these parameters.

The copper Damascene process is increasingly used for the fabrication of IC (cf., for example, the European patent application EP 1 306 415 A2, page 2, paragraph [0012]). In order to produce the copper circuit paths, it is necessary to remove a copper layer chemically mechanically in this process with the help of a CMP slurry, which process is also called "copper CMP process" in the art. The completed copper circuit paths are embedded in a dielectric. Customarily, a barrier layer is located between the copper and the dielectric.

The CMP agents or slurries customarily used in these CMP processes contain dispersed, colloidal inorganic particles such as silica particles as abrasive materials.

For example, the US patent application US 2006/0243702 A1 discloses a CMP slurry containing
- colloidal silica as an abrasive material,
- organic polymeric particles such as polymethyl methacrylate or polystyrene particles which may be integrated with the colloidal silica to form a complex particle,
- an oxidizing agent such as hydrogen peroxide,
- a water-soluble polymeric compound such as polyvinylpyrrolidone or polyvinyl alcohol,
- a first complexing agent forming a water-insoluble complex with copper, having a wet etching rate of less than 3 nm/min and acting as a protective film forming agent, such as quinaldinic acid, quinolinic acid, benzotriazole BTA, benzoimidazole, 7-hydroxy-5-methyl-1,3,4-triazaindolizine, nicotinic acid and picolinic acid,
- a second complexing agent forming a water-soluble complex with copper, having a wet etching rate of more than 3 nm/min and acting as a polishing-accelerating agent, such as amino acids, as for example, glycine, alanine or trypophane, or organic acids, such as formic acid, lactic acid, acetic acid, tartaric acid, fumaric acid, glycol acid, phthalic acid, maleic acid, oxalic acid, citric acid, malic acid, malonic acid or glutamic acid or their basic salts with ammonia, ethylene diamine or tetramethyl ammonium hydroxide TMAH, and
- surfactants.

However, there are several disadvantages associated with the use of inorganic particles. Due to their high densities, they have a tendency to settle out of their aqueous dispersions. Consequently, the respective CMP agents or slurries can be unstable. Moreover, these CMP agents fail to adequately control dishing and erosion, corrosion, defects of the surface, polishing rate and selectivity among different materials on the surface. Quite often, the inorganic particles and their aggregates cause scratches in the polished surfaces. However, for obvious reasons, such scratches have to be avoided. Moreover, the various amounts of the first complexing agent and the second complexing agent have to be balanced very carefully: if the amount of the first complexing agent is chosen too high, the MRR is decreased to an undesirable extent (in extreme cases down to 0 nm/min); if the amount of the second complexing agent is chosen to high, the static etch rate SER is increased to an undesirable extent. Both effects leads to a disadvantageous decrease in planarization efficiency.

These problems have been ameliorated to a certain degree by the use of organic particles as the abrasive materials.

For example, the European patent application EP 0 919 602 A1 discloses a CMP slurry comprising
  polymeric particles prepared by emulsion polymerization and containing functional groups such as amide groups, hydroxyl groups, methoxy groups or glycidyl groups,
  an oxidizing agent, such as hydrogen peroxide, and
  a complexing agent forming a water-soluble complex with copper, such as ammonium fluoride, acetylacetone, citric acid, tartaric acid, glycine, catechol, lysine and 2-aminoethanesulfonicacid.

A similar CMP slurry is disclosed by the European patent application EP 1 036 836 A1, the said CMP slurry containing
  polymeric particles prepared by emulsion polymerization and containing hydrophilic functional groups, as for example, polymeric particles consisting of copolymerized methyl methacrylate, methoxypolyethyleneglycol methacrylate, 4-vinylpyridine and containing amino, pyridyl, polyether and ester groups,
  colloidal inorganic particles such as fumed silica particles,
  an oxidizing agent such as hydrogen peroxide, and
  an organic acid such as p-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid, phthalic acid, quinaldinic acid, quinolinic acid, nicotinic acid and picolinic acid for improving the polishing rate.

It is mandatory that the zeta potential of the polymeric particles and the zeta potential of the inorganic particles are of the opposite signs so that both kinds of particles are electrostatically bonded to form composite particles. However, this can cause an undesirable agglomeration of the particles.

Moreover, the European patent EP 1 077 240 B1 discloses a CMP slurry comprising
  polymeric particles prepared by radical polymerization of olefinically unsaturated comonomers and containing functional groups such as amino, pyridyl or acrylamide groups that can react with the metal of the surface to be polished,
  a complexing agent such as benzotriazole BTA, tolyltriazole, thiourea, benzoimidazole, benzofloxane, 1,2,3-benzothiadiazole, 2-mercaptobenzothiazole, 2-mercaptobenzothiadiazole, 2-mercaptobenzooxazole, melamine, salicylaldoxime, o-phenylenediamine, m-phenylenediamine, catechol and o-aminophenol,
  an oxidizing agent such as potassium persulfate, and
  a complexing agent acting as a passivating agent selected from the group of complexing agents, in particular, salicylaldoxime, benzotriazole BTA, quinaldinic acid or 7-hydroxy-5-methyl-1,3,4-triazaindolizine.

However, the problem of staining is not completely resolved by the known CMP slurries. Due to the high density of functional groups such as amino groups or pyridyl groups, the polymeric particles are strongly absorbed on the metal surfaces to be polished, in particular, copper surfaces, which, on the one hand, helps to increase the material removal rate MRR but, on the other hand, leaves the polished surface stained. On the other hand, it frequently happens that no staining occurs but then the MRR can become so low as to be impractical; in extreme cases the MRR is reduced to 0 nm/min. Moreover, as some of the known CMP slurries must also contain inorganic colloidal particles, the danger of scratching is still present.

The problem of scratching can be resolved to a certain degree by a CMP slurry known from the international patent application WO 2005/014753 A1 and comprising
  organic polymeric particles consisting of melamine-formaldehyde resins as well as
  organic non-polymeric particles consisting of melamine, melamine derivatives such as acetoguanamine, benzoguanamine and dicyandiamide, and their salts as the abrasive materials,
  an oxidizing agent,
  a chelating agent such as a polyamine like ethylenediamine, 2,2'-bipyridine or diethylenetriamine, a polyaminocarboxylic acid like nitrilotriacetic acid, ethylenediaminetetraacetic acid or diethylenetriaminepentaacetic acid and their sodium or potassium salts, and an amino acid like glycine, and
  a passivating agent like a phosphate, benzotriazole BTA, benzothiazole, 1-H-benzotriazoleacetonitrile, benzotriazole-5-carboxylic acid, 2(3H)-benzothiazolone and 1-H-benzotriazole-1-methanol.

It is believed that the melamine particles of this prior art CMP slurry are broken up by the shearing forces during CMP at the peaks on the surfaces to be polished. In this way, a high concentration of melamine is generated in situ at these locations, which concentration, in turn, leads to a high material removal rate MRR. However, the static etch SER is also high, whereby the planarization efficiency is decreased. In addition to this, the CMP slurry can still leaves stains on the polished surfaces. Moreover, the effective concentration of the oxidizing agent can be decreased when too high an amount of organic non-polymeric particles is used.

OBJECTS OF THE INVENTION

It was the object of the present invention to provide novel aqueous polishing agents for the polishing, in particular for the CMP of patterned and unstructured metal surfaces, preferably of patterned metal surfaces, more preferably of metal patterns embedded in dielectric materials, in particular copper containing patterns, which novel polishing agents do not exhibit the disadvantages of the prior art.

In particular, the novel aqueous polishing agents ought to have an excellent polishing efficiency without causing dishing during the copper damascene process. The novel aqueous polishing agents ought to exhibit no undesired corrosive effects and ought not to effectuate defects, scratches and pitting in the materials to be polished.

Additionally, the novel aqueous polishing agents should not leave stains on the polished surfaces and exhibit a low static etch rate SER and a high material removal rate MRR so that the planarization efficiency is high.

Moreover, it was the object of the invention to provide a novel polishing process, preferably a novel CMP process for polishing, preferably for chemically and mechanically polishing, patterned and unstructured, preferably patterned metal surfaces, most preferably metal surfaces embedded in dielectric materials, and particularly of copper containing structures, which novel polishing process does no longer exhibit the disadvantages of the prior art and does not effectuate dishing in the materials to be polished and does not lead to undesired corrosion and to defects, scratches and pitting in the materials to be polished and exhibits a high planarization efficiency and does not leave stains on the polished surfaces.

SUMMARY OF INVENTION

Accordingly, the novel aqueous polishing agent has been found, comprising
(A) at least one type of solid polymer particles which are finely dispersed in the aqueous phase and capable of
strongly interacting with the metal of and/or the metal oxides on top of the surfaces to be polished and
forming strong complexes with the metal of the surfaces to be polished
as an abrasive;
(B) at least one organic non-polymeric compound which is dissolved in the aqueous phase and capable of
strongly interacting with the metal of and/or the metal oxides on top of the surfaces to be polished,
forming strong, water-soluble complexes with the said metal, and
causing an increase of the material removal rate MRR and of the static etch rate SER of the metal surfaces to be polished with increasing concentration of the compound (B) in the aqueous polishing agent
as a hard complexing agent; and
(C) at least one organic non-polymeric compound which is dissolved in the aqueous phase and capable of
interacting with the metal of and/or the metal oxides on top of the surfaces to be polished,
forming slightly soluble or insoluble complexes with the metal of the surfaces to be polished, which complexes are capable of being adsorbed by the metal surfaces to be polished, and
causing a lower increase of the material removal rate MRR than the compound (B) and a lower increase of the static etch rate SER than the compound (B) or no increase of the static etch rate SER of the metal surfaces to be polished with increasing concentration of the compound (C) in the aqueous polishing agent
as a soft complexing agent.

Hereinafter, the novel aqueous polishing agent is referred to as the "CMP agent of the invention".

Additionally, a novel process for the chemical and mechanical polishing of patterned and unstructured metal surfaces has been found, comprising the steps of
(I) selecting at least one type of solid polymer particles (A) which can be finely dispersed in the aqueous phase and are capable of
strongly interacting with the metal of and/or the metal oxides on top of the surfaces to be polished and
forming strong complexes with the metal of the surfaces to be polished
as an abrasive;
(II) selecting at least one organic non-polymeric compound (B) which can be dissolved in the aqueous phase and is capable of
strongly interacting with the metal of and/or the metal oxides on top of the surfaces to be polished,
forming strong, water-soluble complexes with the said metal, and
causing an increase of the material removal rate MRR and of the static etch rate SER of the metal surfaces to be polished with increasing concentration of the compound (B) in the aqueous polishing agent
as a hard complexing agent;
(III) selecting at least one organic non-polymeric compound (C) which is dissolved in the aqueous phase and capable of
interacting with the metal of and/or the metal oxides on top of the surfaces to be polished,
forming slightly soluble or insoluble complexes with the metal of the surfaces to be polished, which complexes are capable of being adsorbed by the metal surfaces to be polished, and
causing a lower increase of the material removal rate MRR than the compound (B) and a lower increase of the static etch rate than the compound (B) or no increase of the static etch rate SER of the metal surfaces to be polished with increasing concentration of the compound (C) in the aqueous polishing agent
as a soft complexing agent;
(IV) preparing an aqueous polishing agent containing the solid polymeric particles (A), the hard complexing agent (B) and the soft complexing agent (C); and
(V) chemically and mechanically polishing the said metal surfaces.

Hereinafter, the novel process for the chemical and mechanical polishing of patterned and unstructured surfaces is referred to as the "CMP process of the invention"

Last but not least, the novel use of the CMP agent of the invention and of the CMP process of the invention for the production of wafers containing integrated circuits comprising copper damascene patterns has been found, which use hereinafter is referred to as the "use of the invention".

Advantages of the Invention

In view of the prior art discussed above, it was surprising and could not be expected by the skilled artisan that the objects underlying the present invention could be solved by the CMP agent, the CMP process and the use of the invention.

In particular, it was surprising that the CMP agent of the invention was excellently suited for the CMP of patterned and unstructured metal surfaces, preferably of patterned metal surfaces, more preferably of metal patterns embedded in dielectric materials, in particular copper containing patterns, and did not exhibit the disadvantages of the prior art.

In particular, the CMP agent of the invention had an excellent polishing efficiency without causing dishing during the copper damascene process. The CMP agent of the invention exhibited no undesired corrosive effects and did not to effectuate defects, scratches and pitting in the materials to be polished.

Additionally, the CMP agent of the invention did not leave stains on the polished surfaces and exhibited a low static rate SER and a high material removal rate MRR so that the planarization efficiency was high.

Moreover, the CMP process of invention was also excellently suited for polishing, preferably for chemically and mechanically polishing, patterned and unstructured, preferably patterned metal surfaces, most preferably metal surfaces embedded in dielectric materials, and particularly of copper containing structures, and did no longer exhibit the disadvantages of the prior art. In particular, it did not effectuate dishing in the materials to be polished and did not lead to undesired corrosion and to defects, scratches and pitting in the materials to be polished, exhibited a high planarization efficiency and did not leave stains on the polished surfaces.

All in accordance with the use of the invention, the CMP agent and the CMP process of the invention were excellently suited for the production of wafers containing copper damascene patterns. Therefore, an exceptionally high fabrication efficiency in the production of a ultrahigh density integrated circuits (ICs) could be achieved.

DETAILED DESCRIPTION OF THE INVENTION

The CMP agent of the invention is based on the careful selection of its essential components (A), (B) and (C).

The CMP agent of the invention comprises at least one type, preferably one type, of solid polymer particles (A) as the first essential component.

The solid polymer particles (A) are stable under the conditions of the CMP process of the invention hereinafter described. The term "stable" means that the concerned solid polymer particles (A) are neither partially nor completely destroyed by the chemical action of the other constituents of the CMP agents of the invention and of the materials to be polished and by the mechanical effects during polishing under pressure, in particular by the shearing forces during the CMP process of the invention.

The properties of the solid polymer particles (A) can be adjusted by the selection of the molecular weight, the surface functionality, the glass transition temperature and the structure of the particles (A) described below.

Preferably, the number average molecular weight is high, more preferably, higher than 10,000 Dalton, more preferably higher than 100,000 Dalton and most preferably higher than 1,000,000 Dalton. In the case of cross-linked solid polymer particles (A) the number average molecular weight is theoretically infinite.

Preferably, their glass transition temperature is above room temperature, more preferably above 50° C. and most preferably above 100° C. as measured by differential scanning calorimetry DSC.

The solid polymer particles (A) are finely dispersed in the aqueous phase of the CMP agent of the invention. Their particle size can vary broadly. Preferably, they have a particle size in the range of from 1 to 500 nm, more preferably 5 to 300 nm, most preferably 10 to 250 nm and particularly 20 to 200 nm as measured by HPPS dynamic light scattering.

The particle size distribution can be monomodal or multimodal, in particular bimodal. In order to have an easily reproducible property profile and easily reproducible conditions during the CMP process of the invention, a monomodal particle size distribution is preferred. The particle size distribution can also vary broadly. In order to have an easily reproducible property profile and easily reproducible conditions during the CMP process of the invention a narrow particle size distribution is preferred. Preferably, the mean particle size $d_{50}$ is in the range of from 2 to 450 nm, more preferably 10 to 250 nm, most preferably 20 to 200 nm and particularly 25 to 150 nm as measured by HPPS dynamic light scattering.

The solid polymer particles (A) are capable of interacting with the metal of and/or the metal oxides on top of the surfaces to be polished. "Interaction" or "interacting" means that the solid polymer particles (A) have a strong affinity to the said metal surface and/or the metal oxides on top of it generated during the CMP process of the invention and, absent the soft complexing agents (C) hereinafter described, are physically and/or chemically adsorbed by the said surface. The physical adsorption is accomplished, for example, by electrostatic attraction and/or Van der Waals forces. The chemical adsorption is accomplished, for example, by the formation of ionic or covalent bonds.

In the context of the present invention the term "metal" also includes metal alloys. Preferably, the metal has a standard reduction potential $E^0>-0.1$ V, preferably $>0$ V, most preferably $>0.1$ V and in particular $>0.2$ V for the half-reaction $M \leftrightarrow M^{n+}+n\ e^-$, wherein n=integer of from 1 to 4 and $e^-$=electron.

Examples for such standard reduction potentials $E^0>-0.1$ are listed in the CRC Handbook of Chemistry and Physics, 79th edition, 1998-1999, CRC Press LLC, Electrochemical Series, 8-21 to 8-31.

Preferably, the metal is selected from the group consisting of Ag, Au, Bi, Cu, Ge, Ir, Os, Pd, Pt, Re, Rh, Ru, Tl and W, most preferably Ag, Au, Cu, Ir, Os, Pd, Pt, Re, Rh, Ru and W. In particular, the metal is copper.

The solid polymer particles (A) are capable of forming strong complexes with the said metals, in particular, copper. These strong complexes can be formed with the zerovalent metal atoms and/or the respective metal cations. "Strong" means that the complexes have a very low dissociation constant due to a high thermodynamic and/or kinetic stability so that the chemical equilibrium is shifted to the side of the complexes.

The capability of the solid polymer particles (A) of forming strong complexes is influenced by the chemical nature of their polymer chains and functional groups, their outer shape and their structure.

Thus, the solid polymer particles (A) can have different shapes. For example, they can have the shape of cubes, cubes with champfered edges, octahedrons, icosahedrons, nodules or spheres with or without protrusions or indentations. Preferably, they are spherical with no or only very few protrusions or indentations because this shape increases both, the resistance to the mechanical forces the particles are exposed to during the CMP process of the invention and the chemical stability to the other components of the CMP agent of the invention.

Moreover, they can be homogeneous materials or inhomogeneous materials such as composite materials or materials with core-shell structures. They can be hollow or compact. Or they can have a spongy structure with a high specific surface capable of absorbing metal atoms or cations. Preferably, they are compact and, more preferably, also essentially or completely homogeneous, because this increases both, the resistance of the particles (A) to the mechanical forces and their chemical stability.

Additionally, they can have a dendrimeric structure with a high number of functional groups at the periphery of the dendrimeric structure. Or they can contain or consist of non-cross-linked, entangled, linear or slightly branched polymer chains. Preferably, they contain or consist of cross-linked polymer chains, because this further increases both, the resistance of the particles (A) to the mechanical forces and their chemical stability.

Preferably, the functional groups are terminal and/or side groups which are attached to the polymer chains. In principle, any group capable of forming bonds between the zerovalent metal atoms or metal cations, in particular copper and copper cations, can be used as functional groups. More preferably the functional groups are cationic groups or groups capable of forming cations in an acidic aqueous phase. Most preferably, the functional groups are selected from the group consisting of primary, secondary and tertiary amino groups and quaternary ammonium groups.

Preferably, the solid polymer particles (A) are selected from the group of cross-linked polymers containing or consisting of polymer chains selected from the group consisting of condensation polymers and copolymers, addition polymers and copolymers and polymers and copolymers obtainable by anionic, cationic or radical polymerization of olefinically unsaturated monomers, wherein all of the polymerized monomers or at least the part of the copolymerized comonomers contain at least one of the functional groups described above.

More preferably, the solid polymer particles (A) are selected from the group of polymers consisting of polymer chains selected from the group consisting of copolymers obtainable by anionic, cationic or radical polymerization of olefinically unsaturated comonomers, most preferably by the radical polymerization of olefinically, in particular, ethylenically unsaturated comonomers in solution, emulsion or suspension, in particular in emulsion, wherein at least the part of the copolymerized comonomers contain at least one of the functional groups described above. Most preferably, at least one of the comonomers contains at least two olefinically, in particular, ethylenically unsaturated groups for the cross-linking of the polymer chains.

The polymers chains themselves can be selected from the group consisting of linear, branched or comb-like polymer chains. In the case of the copolymers they can contain the copolymerized monomers in a statistical, alternating and/or block-like distribution.

Preferably, the condensation and the addition polymers and copolymers are selected from the group consisting of polyesters, alkyd resins, polyurethanes, polylactones, polycarbonates, polyethers, epoxy resin-amine adducts, polyureas, polyamides, polyimides, polyester-polyurethanes, polyether-polyurethanes and polyester-polyether-polyurethanes.

Preferably, the polymers and copolymers obtained by the anionic, cationic and radical polymerization of olefinically unsaturated monomers and comonomers are selected from the group of acrylate and methacrylate polymers and copolymers, in particular acrylate and methacrylate copolymers. The said copolymers can contain minor amounts of olefinically unsaturated comonomers other than the acrylate and methacrylate comonomers, as for example, vinyl aromatic compounds.

The preferably used polymers and copolymers obtained by the anionic, cationic and radical polymerization of olefinically unsaturated monomers and comonomers are well-known materials and are described, for example, in the European patent EP 1 077 240 B1, page 3, paragraph [0018] to page 4, paragraph [0028] and page 4, paragraph [0032] to page 6, paragraph [0046].

The CMP agents of the invention can contain the first essential component, namely the solid polymer particles (A), in varying amounts. Preferably, the amount of the first essential component (A) is from 0.1 to 20% by weight, more preferably 0.2 to 15% by weight, most preferably 0.3 to 10% by weight and particularly 0.5 to 5% by weight, based on the complete weight of a given CMP agent of the invention.

The CMP agent of the invention contains at least one, in particular one, organic non-polymeric compound (B) as the second essential component. The organic non-polymeric compound (B) is also referred to as "hard complexing agent (B)".

The hard complexing agent (B) is dissolved in the aqueous phase of the CMP agent of the invention. It is capable of interacting with the metal of and/or the metal oxides on top of the surfaces to be polished. "Interaction" or "interacting" means that the hard complexing agent (B) has a strong affinity to the said metal surface and/or the metal oxides on top of it generated during the CMP process of the invention. It is furthermore capable of forming strong, water-soluble complexes with the said metals, in particular, copper. These strong complexes can be formed with the zerovalent metal atoms and/or the respective metal cations. "Strong" means that the complexes have a very low dissociation constant due to a high thermodynamic and/or kinetic stability so that the chemical equilibrium is shifted to the side of the complexes.

It is essential that the hard complexing agent (B) causes an increase of the material removal rate MRR of the metal surfaces to be polished with increasing concentration of the hard complexing agent (B) in the CMP agent of the invention, in particular, under the conditions of the CMP process of the invention.

Moreover, it is also essential that the hard complexing agent (B) causes an increase of the static etch rate SER of the metal surfaces to be polished with increasing concentration of the hard complexing agent (B) in the CMP agent of the invention.

The skilled artisan can select suitable hard complexing agents (B) by varying their amounts, leaving the amounts of all the other components of the CMP agent of the invention constant and measuring the MRR and SER of the respective CMP agents of the invention.

In principle, all organic non-polymeric compounds having the property profile described above can be selected as the hard complexing agent (B).

Preferably, the hard complexing agent (B) is selected from the group consisting of polyamines, carboxylic acids, polyaminocarboxylic acids and basic amino acids.

More preferably, the polyamine (B) is selected from the group consisting of ethylenediamine, propylenediamine and diethylenetriamine.

More preferably, the carboxylic acid (B) is selected from the group consisting of p-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid and phthalic acid.

More preferably, the polyaminocarboxylic acid (B) is selected from the group consisting of nitrilotriacetic acid, ethylenediaminetetraacetic acid and diethylenetriaminepentaacetic acid.

More preferably, the amino acid (B) is selected from the group consisting of glycine, lysine, arginine and histidine, most preferably glycine and lysine.

The amino acids (B) are particularly preferably used.

The CMP agents of the invention can contain the second essential component, namely the hard complexing agent (B) in varying amounts. Preferably, the amount of the hard complexing agent (B) is from 0.05 to 5% by weight, more preferably 0.05 to 4% by weight, most preferably 0.05 to 3% by weight and particularly 0.05 to 2% by weight, based on the complete weight of a given CMP agent of the invention.

The CMP agent of the invention contains at least one, in particular one, organic non-polymeric compound (C) as the second essential component. The organic non-polymeric compound (C) is also referred to as "soft complexing agent (C)".

It is essential that the soft complexing agent (C) is dissolved in the aqueous phase of the CMP agent of the invention, i.e., the soft complexing agent (C) does not form a separate phase, neither solid nor liquid, in the CMP agent of the invention. Therefore, care has to be taken that the concentration of the soft complexing agent (C) does not exceed its saturation concentration in the aqueous phase.

The soft complexing agent (C) is capable of interacting with the metal of and/or the metal oxides on top of the surfaces to be polished. "Interaction" or "interacting" means that the soft complexing agents (C) have a strong affinity to the said metal surface and/or the metal oxides on top of it generated during the CMP process of the invention.

The soft complexing agent (C) is furthermore capable of forming water-insoluble complexes with the said metals, in particular, copper. These water-insoluble complexes can be formed with the zerovalent metal atoms and/or the respective metal cations. "Water-insoluble" means that the complexes do not dissolve in the aqueous phase to a large extent or that their rate of dissolution is very low.

The said complexes of the soft complexing agent (C) are capable of being adsorbed by the metal surfaces to be polished physically and/or chemically. The physical adsorption is accomplished, for example, by electrostatic attraction and/or Van der Waals forces. The chemical adsorption is accomplished, for example, by the formation of ionic or covalent bonds.

It is furthermore essential for the soft complexing agent (C) that it causes a lower increase of the material removal rate MRR than the hard complexing agent (B) of the metal surfaces to be polished with increasing concentration of the soft complexing agent (C) in the CMP agent of the invention, in particular under the conditions of the CMP process of the invention.

Additionally, it exhibits a lower increase of the static etch rate SER than the hard complexing agent (B) of the metal surfaces to be polished with its increasing concentration in the CMP agent of the invention, in particular under the conditions of the CMP process of the invention. In the alternative, it exhibits no increase of the static etch rate SER of the metal surfaces to be polished with its increasing concentration in the CMP agent of the invention, in particular under the conditions of the CMP process of the invention; i.e., the SER is virtually independent of the concentration of the soft complexing agent (C).

It must be emphasized that the soft complexing agent (C) must not act as a passivating agent such as benzotriazole BTA, which passivating agent decreases the material removal rate MRR with its increasing concentration in an aqueous polishing agent used for CMP.

The skilled artisan can select suitable soft complexing agents (C) by varying their amounts, leaving the amounts of all the other components of the CMP agent of the invention constant and measuring the MRRs and SERs of the respective CMP agents of the invention.

In principle, all organic non-polymeric compounds having the property profile set out above can be used as the soft complexing agent (C).

Preferably, the soft complexing agent (C) is selected from the group consisting of dicyandiamide and, more preferably so, triazines containing at least one, preferably two and more preferably three primary amino groups.

Most preferably, the triazine (C) is selected from the group consisting of melamine and water-soluble guanamines, particularly melamine, formoguanamine, acetoguanamine and 2,4-diamino-6-ethyl-1,3,5-triazine. Melamine is most particularly preferably used.

The CMP agents of the invention can contain the third essential component, namely the soft complexing agent (C) in varying amounts. Preferably, the amount of the soft complexing agent (C) is from 0.05 to 5% by weight, more preferably 0.05 to 4% by weight, most preferably 0.05 to 3% by weight and particularly 0.05 to 2% by weight, based on the complete weight of a given CMP agent of the invention.

The CMP agent of the invention can furthermore contain at least one additional component (D) customarily used in the art of CMP. Preferably, the additional component is the selected from the group of oxidizing agents, surfactants, polyvalent metal ions, pH regulators and solid inorganic particles, more preferably oxidizing agents and pH regulators. The additional component (D) is preferably used in the known effective amounts.

Suitable oxidizing agents (D) and their effective amounts are known, for example, from the European patent application EP 1 036 836 A1, page 8, paragraphs [0074] and [0075]. Preferably, organic and inorganic peroxides, more preferably inorganic peroxides, are used. In particular hydrogen peroxide is used.

Suitable surfactants (D) and their effective amounts are known, for example, from the international patent application WO 2005/014753 A1, page 8, line 23, to page 10, line 17.

Suitable polyvalent metal ions (D) and their effective amounts are known, for example, from the European patent application EP 1 036 836 A1, page 8, paragraph [0076] to page 9, paragraph [0078].

Suitable pH regulators (D) are known, for example, from the European patent application EP 1 036 836 A1, page 8, paragraphs [0080], [0085] and [0086], or the international patent application WO 2005/014753 A1, page 12, lines 19 to 24. Most preferably, the pH of the CMP agent of the invention is adjusted to 3 to 7, particularly 4 to 6.

Suitable solid inorganic particles (D) which may be used as additional as inorganic abrasive particles and their effective amounts are known, for example, from the international patent application WO 2005/014753 A1, page 12, lines 1 to 8.

The CMP agent of the invention is preferably prepared in the course of the CMP process of the invention, which comprises the steps of (I) selecting at least one type of solid polymer particles (A) which can be finely dispersed in the aqueous phase and are capable of
strongly interacting with the metal of and/or the metal oxides on top of the surfaces to be polished and
forming strong complexes with the metal of the surfaces to be polished
as an abrasive, in particular solid polymer particles (A) as described hereinbefore;

(II) selecting at least one organic non-polymeric compound (B) which can be dissolved in the aqueous phase and is capable of
strongly interacting with the metal of and/or the metal oxides on top of the surfaces to be polished,
forming strong, water-soluble complexes with the said metal, and
causing an increase of the material removal rate MRR and the static etch rate SER of the metal surfaces to be polished with increasing concentration of the compound (B) in the aqueous polishing agent
as a hard complexing agent, preferably a hard complexing agent (B) as described hereinbefore;

(III) selecting at least one organic non-polymeric compound (C) which is dissolved in the aqueous phase and capable of
interacting with the metal of and/or the metal oxides on top of the surfaces to be polished,
forming slightly soluble or insoluble complexes with the metal of the surfaces to be polished, which complexes are capable of being adsorbed by the metal surfaces to be polished, and
causing a lower increase of the material removal rate MRR than the compound (B) and a lower increase of the static etch rate SER than the compound (B) or no increase of the static etch rate SER of the metal surfaces to be polished with increasing concentration of the compound (C) in the aqueous polishing agent as a soft complexing agent, in particular a soft complexing agent (C) as described hereinbefore;

(IIIa) optionally selecting at least one additional component (D), in particular an additional component (D) as described hereinbefore;

(IV) preparing an aqueous polishing agent containing the solid polymeric particles (A), the hard complexing agent (B) and the soft complexing agent (C); and (V) chemically and mechanically polishing the said metal surfaces.

The preparation of the CMP agents of the invention does not exhibit any particularities but can be carried out by dissolving or dispersing the above-described constituents (A), (B) and (C) and optionally (D) in an aqueous medium, in particular de-ionized water For this purpose the customary and standard mixing processes and mixing apparatuses such as agitated vessels, in-line dissolvers, high shear impellers, ultrasonic mixers, homogenizer nozzles or counterflow mixers, can be used. Preferably, the CMP agents of the invention thus obtained are filtered through filters of the appropriate mesh aperture, in order to remove coarse-grained particles such as the agglomerates or aggregates of the solid, finely dispersed abrasives (A).

The CMP agents of the invention are used for the CMP of the most diverse patterned and unstructured, in particular patterned metal surfaces.

Preferably, the patterned metal surfaces consist of metal patterns and metal-dielectric patterns. Most preferably, the metal patterns and the metal-dielectric patterns contain or consist of at least one, in particular one metallic material selected from the group consisting of the metals as defined above and their alloys. In particular, copper is used as the metal.

As the dielectrics, the customarily used organic and inorganic dielectrics can be employed. Examples of suitable dielectrics are known from the European patent application EP 1 306 415 A2, page 4, paragraph [0031]. In particular, silicon dioxide is used as the dielectric.

In particular, the metal-dielectric patterns concern copper-dielectric patterns used in the copper damascene process for the fabrication of wafers with ICs, in particular ultra-high-density ICs.

As is known in the art, the metal-dielectric patterns, in particular the copper-dielectric patterns, can contain customarily used barrier layers. Examples of suitable barrier layers are also known from the European patent application EP 1 306 415 A2, page 4, paragraph [0032].

The polishing process of the invention exhibits no particularities but can be carried out with the processes and the equipment customarily used for the CMP in the fabrication of wafers with ICs.

As is known in the art, a typical equipment for the CMP consists of a rotating platen which is covered with a polishing pad. The wafer is mounted on a carrier or chuck with its upper side down facing the polishing pad. The carrier secures the wafer in the horizontal position. This particular arrangement of polishing and holding device is also known as the hard-platen design. The carrier may retain a carrier pad which lies between the retaining surface of the carrier and the surface of the wafer which is not being polished. This pad can operate as a cushion for the wafer.

Below the carrier, the larger diameter platen is also generally horizontally positioned and presents a surface parallel to that of the wafer to be polished. Its polishing pad contacts the wafer surface during the planarization process. During the CMP process of the invention the aqueous CMP agent of the invention is applied onto the polishing pad as a continuous stream or in dropwise fashion.

Both the carrier and the platen are caused to rotate around their respective shafts extending perpendicular from the carrier and the platen. The rotating carrier shaft may remain fixed in position relative to the rotating platen or may oscillate horizontally relative to the platen. The direction of rotation of the carrier typically, though not necessarily, is the same as that of the platen. The speeds of rotation for the carrier and the platen are generally, though not necessarily, set at different values.

Customarily, the temperature of the platen is set at temperatures between 10 and 70° C.

For further details reference is made to the international patent application WO 2004/063301 A1, in particular page 16, paragraph [0036] to page 18, paragraph [0040] in conjunction with the FIG. 1.

By way of the CMP process of the invention and the CMP agent of the invention wafers with ICs comprising copper damascene patterns can be obtained which have an excellent functionality.

EXAMPLES AND COMPARATIVE EXAMPLES

Synthesis Example 1

Preparation of Solid Polymeric Particles (A)

A 4 L reaction flask fitted with an anchor stirrer, including reflux condenser, 3 feeding lines for feeding at room temperature, was charged under nitrogen with 1500 g of deionized water and 4.5 g of hexadecyltrimethylammonium bromide. The contents of the flask were heated up to 70° C. At this temperature, 0.68 g V-50 (initiator from Wako) were charged to the reaction flask. Simultaneously, a monomer feed consisting 630 g of deionized water, 391.5 g styrene, 60 g of methacrylamide as a 15% solution in water, 4.5 g of divinylbenzene, and 2.48 g of hexadecyltrimethylammonium bromide was started and continually fed for 1.5 hours. At the same time, an initiator feed containing 170 g of deionized water and 2.3 g of V-50 was started and continually fed to the reaction flask for 2.5 hours. After 1.5 hours from the start of the first monomer feed, a second monomer feed consisting of 255 g of deionized water, 13.5 g of 2-dimethylaminoethyl methacrylate (DMAEMA), 0.9 g of hexadecyltrimethylammonium bromide and 31.5 g of styrene was started and continually fed to the reaction flask during 30 minutes. The obtained reaction mixture was post-polymerized for 2 hours at 70° C. and then cooled to room temperature. A dispersion of solid polymeric particles (A) with a solids content of 15% by weight was obtained. The mean particle size $d_{50}$ of the solid polymeric particles (A) was 76 nm as measured by HPPS dynamic light scattering.

Example 1 and Comparative Example 1

Preparation of a CMP Agent Containing a Hard and a Soft Complexing Agent (B) and (C) (Example 1) and of a CMP Agent Only Containing a Hard Complexing Agent (B) (Comparative Example 1)

Using the solid polymer particles (A) of the synthesis example 1, the CMP agent of the comparative example 1 was prepared having the following composition: 1% by weight of solid polymer particles (A), 1% by weight hydrogen peroxide (D) and 0.2% by weight glycine (B). The pH of the CMP agent was adjusted to 5 with nitric acid.

Using the solid polymer particles (A) of the synthesis example 1, the CMP agent of the example 1 was prepared having the following composition: 1% by weight of solid polymer particles (A), 1% by weight hydrogen peroxide (D), 0.2% by weight glycine (B) and 0.3% by weight of completely dissolved melamine (C). The pH of the CMP agent was adjusted to 5 with nitric acid.

The static etch rate SER of the CMP agent of the example 1 and the CMP agent of the comparative example 1 was determined as follows:

Copper discs were initially conditioned, washed, dried and then weighed before each experiment. The copper discs were conditioned by polishing for 30 seconds with a slurry comprising colloidal silica and ferric nitrate. The copper discs were then held by a pair of Teflon covered tongs to reduce contamination and were then directly immersed in the stirred CMP agents of the example 1 and the comparative example 1 at 50° C. The time of immersion was 5 minutes in each case. After the etching, the copper discs were cleaned with deionized water followed by an isopropyl alcohol rinse. Thereafter, the copper discs were dried with a steady stream of pressurized air, and the SER was calculated on the net weight-loss and the surface area of the disc using the following calculation:

$$SER=\text{Weight-loss}/[\text{Density}\times(\text{Circumferential Area}+2\times\text{Area of Cross-section})\times\text{Time}],$$

wherein
Weight-loss=loss of weight in copper disc after dissolution;
Density=density of copper;
Area of Cross-section=cross-section area of the disc;
Circumferential Area=circumferential area of the disc; and
Time=dissolution time.

The static etch rate SER at 50° C. of the CMP agent of the example 1 was 19.7 nm/min, whereas the static etch rate SER at 50° C. of the CMP agent of the comparative example 1 was 44 nm/min.

The material removal rate MRR of the CMP agent of the example 1 and of the CMP agent of the comparative example 1 was determined as follows:

Again, the copper discs were conditioned (as explained before), washed, dried and then weighed before each experiment. Thereafter, they were attached to a stainless steel carrier and then mounted on a single-side polishing machine (CMP benchtop machine of CETR, Center for Tribology, Inc., Campbell, Calif.). A polyurethane IC 1400 polishing pad was used for the experiments. The copper discs were polished for 1 min under a pressure of 17.24 kPa (2.5 psi) by supplying each of the CMP agents at a rate of 60 ml/min on the pad at room temperature. The copper discs had a rotational speed of 115 rpm and the pad had a rotational speed of 112 rpm. The pad was conditioned with diamond grit conditioner to remove the products of the chemical reactions and to make the pad ready for the next run. After polishing, the discs were cleaned with a deionized water rinse followed by an isopropyl alcohol rinse. Thereafter, the discs were dried with a steady stream of pressurized air, and the MRR was calculated based on the net weight-loss in the polished surface area according to the calculation:

$$MRR=\text{Weight-loss}/(\text{Density}\times\text{Area of Cross-section}\times\text{Time});$$

wherein
Weight-loss=loss of weight in copper disc after polish;
Density=density of copper;
Area of Cross-section=cross-section area of the disc; and
Time=polishing time.

The material removal rate MRR of the CMP agent of the example 1 was 487.2 nm/min, whereas the material removal rate MRR of the CMP agent of the comparative example 1 was 396.8 nm/min and, thus, significantly lower than the MRR of the CMP agent of the example 1.

Moreover, the polished copper discs of the comparative example 1 were dull and showed staining, whereas the polished copper discs of the example 1 were shiny without stains.

The ratio MRR/SER for the CMP agent of the example 1 was 24.7, whereas the ratio MRR/SER for the CMP agent of the comparative example 1 was only 9.02, which underlined that the CMP agent of the example 1 had a much higher planarization efficiency than the CMP agent of the comparative example 1.

The invention claimed is:

1. An aqueous polishing agent, comprising:
   solid polymer particles as an abrasive, finely dispersed in an aqueous phase,
   a first organic non-polymeric compound as a hard complexing agent, dissolved in the aqueous phase, and
   a second organic non-polymeric compound as a soft complexing agent, dissolved in the aqueous phase,
   wherein the solid polymer particles comprise a functional group that is a side or terminal group capable of interacting with a metal of, a metal oxide on top of, or the metal of and the metal oxide on top of a surface to be polished and capable of forming a strong complex with the metal of the surface to be polished, the functional group being at least one group selected from the group consisting of a primary amino group, a secondary amino group, a tertiary amino group, and a quaternary ammonium group, and wherein
   the solid polymer particles comprise a cross-linked polymer comprising at least one polymer chain selected from the group consisting of a polymer obtained by anionic, cationic, or radical polymerization of an olefinically unsaturated monomer,
   the first organic non-polymeric compound is capable of interacting with the metal of, the metal oxide on top of, or both the metal of and the metal oxide on top of the surface to be polished, capable of forming a strong, water-soluble complex with the metal, and capable of causing an increase of a material removal rate MRR and a static etch rate SER of the surface to be polished with increasing concentration of the first organic non-polymeric compound in the aqueous polishing agent, and
   the second organic non-polymeric compound is capable of interacting with the metal of, the metal oxide on top of, or both the metal of and the metal oxide on top of the surface to be polished, capable of forming a slightly soluble or insoluble complex with the metal of the surface to be polished, and capable of causing a lower increase of the material removal rate MRR than the first organic non-polymeric compound and a lower increase of the static etch rate SER than the first organic non-polymeric compound or no increase of the static etch rate SER of the metal surface to be polished with increasing concentration of the second organic non-polymeric compound in the aqueous polishing agent, and
   wherein the slightly soluble or insoluble complex is capable of being absorbed by the metal surface to be polished.

2. The aqueous polishing agent of claim 1, wherein the first organic non-polymeric compound is at least one compound selected from the group consisting of a polyamine, a carboxylic acid, a polyaminocarboxylic acid, and a basic amino acid.

3. The aqueous polishing agent of claim 2, wherein the first organic non-polymeric compound comprises at least one amino acid selected from the group consisting of glycine, lysine, arginine, and histidine.

4. The aqueous polishing agent of claim 1, wherein the second organic non-polymeric compound is selected from the group consisting of dicyandiamide and a triazine comprising at least one primary amino group.

5. The aqueous polishing agent of claim 4, wherein the second organic non-polymeric compound comprises a triazine selected from the group consisting of melamine and a water-soluble guanamine.

6. The aqueous polishing agent of claim 5, wherein the triazine is selected from the group consisting of melamine, formoguanamine, acetoguanamine and 2,4-diamino-6-ethyl-1,3,5-triazine.

7. The aqueous polishing agent of claim 1, comprising at least one additional component selected from the group consisting of an oxidizing agent, a surfactant, a polyvalent metal ion, a pH regulator, and a solid inorganic particle.

8. The aqueous polishing agent of claim 7, comprising an organic or inorganic peroxide.

9. The aqueous polishing agent of claim 1, wherein a pH value of the aqueous polishing agent is from 3 to 7.

10. The aqueous polishing agent of claim 1, wherein the metal is copper.

11. The aqueous polishing agent of claim 1, wherein the solid polymer particles are physically and/or chemically absorbed to the metal surface.

12. The aqueous polishing agent of claim 1, wherein the first organic-non polymeric compound has a strong affinity to the metal surface and/or the metal oxides on top of the metal surface.

13. The aqueous polishing agent of claim 1, wherein the second organic-non polymeric compound has a strong affinity to the metal surface and/or the metal oxides on top of the metal surface.

14. The aqueous polishing agent of claim 1, wherein the polymer chain is formed by a process comprising radical polymerization of olefinically unsaturated comonomers in an emulsion.

15. The aqueous polishing agent of claim 14, wherein at least one of the olefinically unsaturated comonomers comprises at least two olefinically unsaturated groups.

16. The aqueous polishing agent of claim 14, wherein at least one of the olefinically unsaturated comonomers comprises at least two ethylenically unsaturated groups.

17. A process for chemical and mechanical polishing of a patterned and unstructured metal surface, comprising:
preparing an aqueous polishing agent comprising solid polymeric particles as an abrasive finely dispersed in an aqueous phase, a first organic non-polymeric compound as a hard complexing agent dissolved in the aqueous phase, and a second organic non-polymeric compound as a soft complexing agent dissolved in the aqueous phase, and
chemically and mechanically polishing the metal surface
wherein the solid polymer particles comprise a functional group that is a side or terminal group capable of interacting with a metal of, a metal oxide on top of, or the metal of and the metal oxide on top of a surface to be polished and capable of forming a strong complex with the metal of the surface to be polished, the functional group being at least one group selected from the group consisting of a primary amino group, a secondary amino group, a tertiary amino group, and a quaternary ammonium group, and wherein
the solid polymer particles comprise a cross-linked polymer comprising at least one polymer chain selected from the group consisting of a polymer obtained by anionic, cationic, or radical polymerization of an olefinically unsaturated monomer,
the first organic non-polymeric compound is capable of strongly interacting with the metal of, the metal oxide on top of, or both the metal of and the metal oxide on top of the surface to be polished, capable of forming strong, water-soluble complexes with the metal, and capable of causing an increase of a material removal rate MRR and a static etch rate SER of the surface to be polished with increasing concentration of the first organic non-polymeric compound in the aqueous polishing agent,
the second organic non-polymeric compound is capable of interacting with the metal of, the metal oxide on top of, or both the metal of and the metal oxide on top of the surface to be polished, capable of forming a slightly soluble or insoluble complex with the metal of the surface to be polished, and capable of causing a lower increase of the material removal rate MRR than the first organic non-polymeric compound and a lower increase of the static etch rate SER than the first organic non-polymeric compound or no increase of the static etch rate SER of the metal surface to be polished with increasing concentration of the second organic non-polymeric compound in the aqueous polishing agent, and
wherein the slightly soluble or insoluble complex is capable of being absorbed by the metal surface to be polished.

18. A process for chemical and mechanical polishing of a patterned and unstructured metal surface, comprising:
preparing the aqueous polishing agent of claim 1, and
chemically and mechanically polishing the metal surface.

19. A process for production of a wafer comprising an integrated circuit comprising a copper damascene pattern, the process comprising the process of claim 18.

20. A copper damascene process comprising the process of claim 17.

* * * * *